United States Patent [19]

Ogino et al.

[11] Patent Number: 5,960,536
[45] Date of Patent: Oct. 5, 1999

[54] METHOD FOR THE PREPARATION OF A WIRING CIRCUIT BOARD FOR MOUNTING OF A SEMICONDUCTOR

[75] Inventors: Tsutomu Ogino, Nagano-ken; Hiroto Komatsu, Saitama-ken, both of Japan

[73] Assignee: Shin-Etsu Polymer Co., Ltd., Tokyo, Japan

[21] Appl. No.: 08/940,363

[22] Filed: Sep. 30, 1997

Related U.S. Application Data

[62] Division of application No. 08/671,654, Jun. 28, 1996.

[30] Foreign Application Priority Data

Jun. 29, 1995 [JP] Japan .................................... 7-185042

[51] Int. Cl.⁶ ...................................................... H05K 3/32
[52] U.S. Cl. .................................. 29/841; 29/739; 29/740
[58] Field of Search ............................. 29/840, 841, 739, 29/740, 832, 729, 762

[56] References Cited

U.S. PATENT DOCUMENTS

| | | | |
|---|---|---|---|
| 4,218,701 | 8/1980 | Shirasaki | 357/72 |
| 4,649,418 | 3/1987 | Uden | 357/80 |
| 4,731,693 | 3/1988 | Berg et al. | 361/386 |
| 4,769,344 | 9/1988 | Sakai et al. | 437/216 |
| 5,206,794 | 4/1993 | Long | 257/675 |
| 5,617,294 | 4/1997 | Watson et al. | 361/719 |
| 5,825,625 | 10/1998 | Esterberg et al. | 361/719 |

*Primary Examiner*—Lee W. Young
*Assistant Examiner*—Bobby Rushing, Jr.
*Attorney, Agent, or Firm*—McAulay Nissen Goldberg Kiel & Hand, LLP

[57] ABSTRACT

Proposed is a novel wiring circuit board for mounting of a semiconductor chip suitable for free mounting and demounting thereof. The wiring circuit board comprises: an insulating base plate provided with electrodes on one surface and having an opening for insertion of the semiconductor chip; bonding wires each connected to one of the electrodes at one end, with the other end appearing in the opening at a position just to come into contact with the electrode of a semiconductor chip inserted into the opening; and a resinous encapsulating layer covering the opening and embedding the bonding wires. A method for the preparation of this wiring circuit board is also disclosed in which accurate positioning of the ends of the bonding wires appearing in the opening of the base plate is accomplished by using a dummy chip provided with etching-resistant false electrodes and inserted into the opening followed by subsequent removal by etching after completion of the bonding work of the bonding wires.

4 Claims, 2 Drawing Sheets

METHOD FOR THE PREPARATION OF A WIRING CIRCUIT BOARD FOR MOUNTING OF A SEMICONDUCTOR

This application is a Divisional of Ser. No. 08/671,654 filed Jun. 28, 1996.

BACKGROUND OF THE INVENTION

The present invention relates to a wiring circuit board for mounting of a chip-formed semiconductor device such as an IC die and the like and a method for the preparation thereof. More particularly, the invention relates to a wiring circuit board, of which a semiconductor chip is freely mountable thereon and freely demountable therefrom so as to enable inspection of the IC die and the like as well as a method for the preparation thereof.

In the prior art, it is conventional to mount a semiconductor device such as a semiconductor chip on a wiring circuit board and to make an electric conduction thereof by connecting the outer electrode terminals of the semiconductor device and the electrode terminals of the wiring circuit board with bonding wires by utilizing a wire-bonding machine and the like.

When a semiconductor chip and a wiring circuit board are connected together by means of the above described connecting structure, it is practically impossible to demount the once mounted semiconductor chip from the wiring circuit board so that, if a defect is detected in the semiconductor chip, the only way for the remedy thereof is to replace the assembly of the semiconductor device and the wiring circuit board as a whole with another defect-free assembly if not to mention the problem that inspection of the individual semiconductor chips alone cannot be undertaken.

SUMMARY OF THE INVENTION

The present invention accordingly has an object to provide a wiring circuit board for mounting of a semiconductor chip such as an IC die and the like without the above described problems and disadvantages in the prior art so as to enable freely mounting and demounting a semiconductor chip on and from the wiring circuit board and enable inspection of an IC die alone and the like as well as to provide a method for the preparation thereof.

Thus, the present invention provides a wiring circuit board for mounting of a semiconductor chip device which is an integral body comprising a base plate having electrode terminals on one surface thereof and provided with a mounting opening or cavity in which a semiconductor chip device is mountable in a demountable fashion, bonding wires being connected to the said electrode terminals on the base plate each at one end, the other end portion of each of the bonding wires appearing in the mounting opening of the base plate in such a fashion as to be contacted with an electrode terminal of the semiconductor chip device inserted into the mounting opening and the bonding wires being embedded in an encapsulating resinous layer covering the mounting opening on one side.

Further, the invention provides a method for the preparation of a wiring circuit board for mounting of a semiconductor chip device defined above which comprises the steps of:

(a) making a mounting opening, in which a semiconductor chip device can be inserted, in a base plate;

(b) inserting, into the said mounting opening, a dummy chip having false electrodes on one surface at positions corresponding to the positions of electrode terminals of an actual semiconductor chip device, the upper surface of the dummy chip being coplanar with the upper surface of the base plate;

(c) connecting each of the false electrodes of the dummy chip and one of the electrode terminals of the base plate with a bonding wire;

(d) encapsulating the bonding wires with an encapsulating layer of a thermocurable resin; and (e) removing the dummy chip to expose one of the ends of each of the bonding wires to the mounting opening.

In the above defined preparation procedure, in particular, the dummy chip is made from a plate removable by etching and the false electrodes are formed by providing a surface of the said plate with a plating layer of gold or other etching-resistant metal.

DETAILED DESCRIPTION OF THE PREFERRED EMBODIMENTS

In the following, preferred embodiments of the invention are described in more detail by making reference to the accompanying drawing.

Figure 1A:
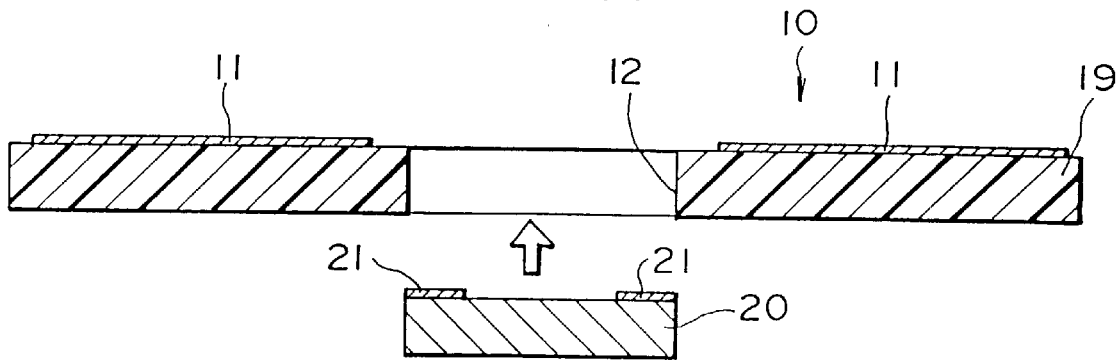
FIGS. 1A, 1B, 1C and 1D are each illustrate a step of the procedure for the preparation of the inventive wiring circuit board for mounting of a semiconductor chip device by a schematic cross sectional view.
Figure 1B:
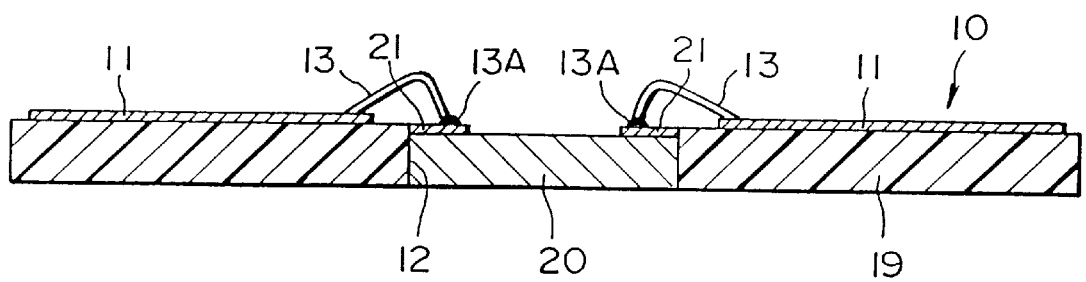
Figure 1C:
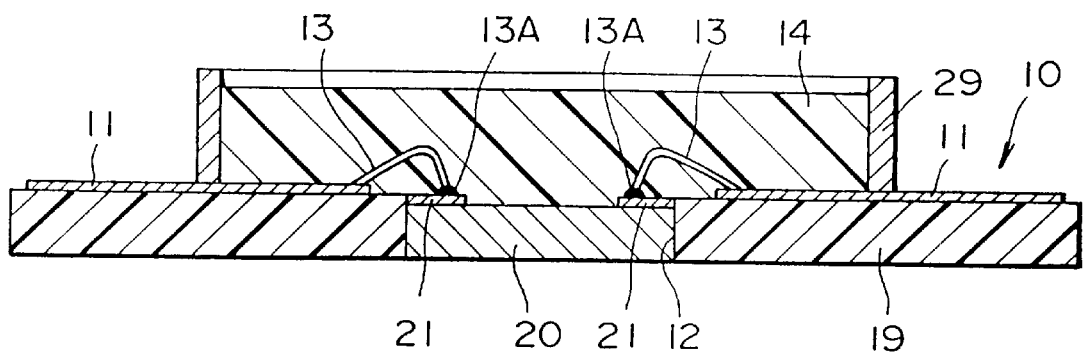
Figure 1D:
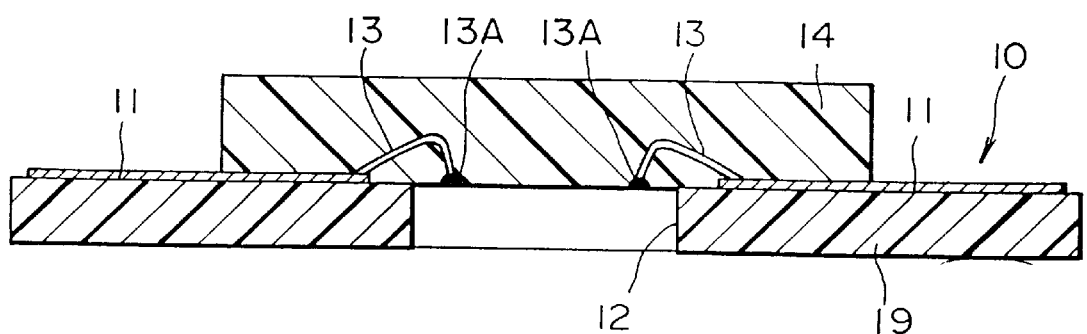
Figure 2:
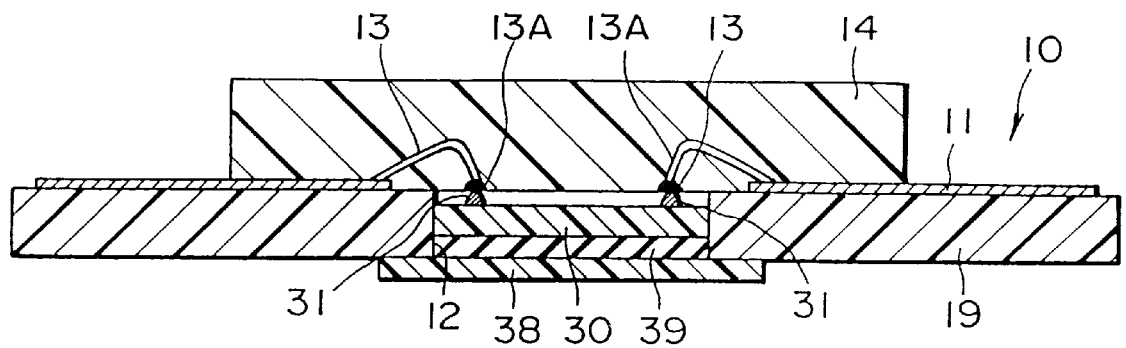
FIG. 2 is a schematic cross sectional view of the inventive wiring circuit board under use for mounting of a semiconductor chip device electrically connected thereto.

FIGS. 1A to 1D each illustrate a schematic cross sectional view of the inventive wiring circuit board under the preparation procedure in the sequential order of steps and FIG. 2 is a schematic cross sectional view of the thus prepared wiring circuit board 10 of the invention with a semiconductor chip device 30 such as an IC die mounted thereon. The IC die 30 is a known device and a plurality of bumped electrode terminals 31 are formed in alignment to protrude on the upper surface thereof. As is described later, the IC die 30 is inserted into the mounting opening or cavity 12 of the wiring circuit board 10 in a freely mountable and demountable fashion and, when inserted into the mounting cavity 12, secured in the position by means of a stopper member 38 with intervention of a rubber-made cushioning member 39. The bumped electrode terminals 31 of the IC die 30 are in resilient contact with the terminal points 13A of the bonding wires 13 by means of the elastic resilience of the rubbery cushioning member 39. The stopper member 38 is fixed to the base plate 19 of the wiring circuit board 10 by a suitable means such as screws or combination of bolts and nuts in a demountable fashion, when necessary.

In the wiring circuit board 10 of the invention, the base plate 19 can be a plate of a conventional electrically insulating material such as an epoxy resin, ceramic and the like or, alternatively, a lead frame, TAB and the like can be used as the base plate 19 thereof. Electrode terminals 11 are formed on the upper surface of the base plate 19 by means of a suitable method such as the method of pattern printing and a mounting cavity or opening 12 is formed to penetrate the base plate 19 from one surface to the other. The mounting cavity or opening 12 should be formed to have such a contour that an actual IC die 30 can be freely inserted thereinto and removed therefrom or, for example, should have a rectangular contour corresponding to an IC die 30 having a rectangular planar contour.

Bonding wires 13 of, for example, a gold filament are connected each at one end thereof to one of the electrode terminals 11 on the base plate 19 and the bonding wires 13 are fully embedded in an encapsulating layer 14 of an insulating resin adhering to the upper surface of the base plate 19 of the wiring circuit board 10. Each of the bonding wires 13 has a semispherical terminal points 13A at the other end and these semispherical terminal points 13A appear in the mounting opening 12 from above each at such a position that one of the bumped electrodes 31 of an IC die 30 comes into contact therewith when the IC die 30 is inserted into the mounting opening 12 from below. The semispherical terminal point 13A of the bonding wire 13 is formed by forming a ball bonding to the false electrode 21 of the dummy chip 20 as is described later.

The encapsulating resin 14 is selected from electrically insulating thermocurable resins exhibiting low shrinkage by curing such as polyimide resins, epoxy resins, silicone resins and the like or, alternatively, from electrically insulating rubbery elastomers such as silicone rubbers and thermoplastic elastomers, of which polyimide resins having high heat resistance are preferred. The encapsulating resin 14 adheres to the surface of the base plate 19 and the bonding wires 13 are completely embedded therein.

Figure 3:
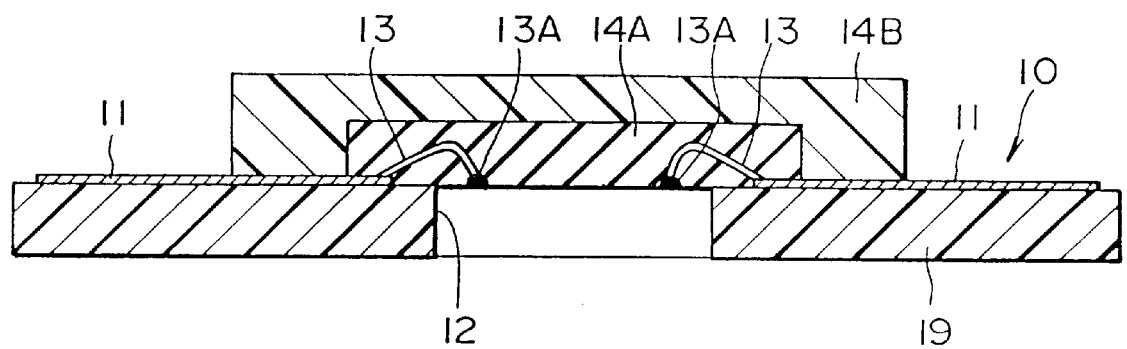
FIG. 3 is a schematic cross sectional view of another embodiment of the inventive wiring circuit board for mounting of a semiconductor chip device.

It is also possible, as is illustrated in FIG. 3, that the encapsulating layer for the bonding wires 13 is formed in a composite structure consisting of an inner encapsulating layer 14A having rubbery elasticity embedding the bonding wires 13 and filling the cavity in an outer encapsulating layer 14B of a relatively rigid resinous material so as to ensure compatibility of rigidity and cushioning resilience. The elastic inner encapsulating layer 14A can be made from an insulating material having rubbery elasticity such as synthetic rubbers, e.g., silicone rubbers, epoxy rubbers and the like, and thermoplastic elastomers, of which silicone rubbers are preferred in respect of their high heat resistance and excellent weatherability.

The wiring circuit board 10 illustrated in FIG. 2 can be prepared in the following manner according to the procedure illustrated in FIGS. 1A to 1D each for one of the steps. Firstly, as is illustrated in FIG. 1A, a mounting opening or cavity 12 is formed in a base plate 19 as an openwork and electrode terminals 11 are formed on the base plate 19. Thereafter, a dummy chip 20 having false electrodes 21 on the upper surface is inserted into the mounting cavity 12 of the base plate 19 from below. The dummy chip 20 has a contour identical with that of an actual IC die 30 (see FIG. 2) to be inserted into the mounting opening 12 when in service. The dummy chip 20 is made from a material capable of being removed subsequently by etching. The false electrodes 21 are formed each in such a position as just to correspond to one of the bumped electrode terminals 31 on the actual IC die 30 to be inserted into the mounting opening 12 by providing a plating layer of, preferably, gold in the position only. The dummy chip 20 is made, for example, from a plate of copper or other material susceptible to etching having a thickness of, for example, 0.5 mm and the same contour as the actual IC die 30 and provided with spot-wise plating layers to serve as the false electrodes 21.

In the next place, the dummy chip 20 in the mounting opening 12 of the base plate 19 is temporarily secured by tack bonding or by using a jig (not shown in the figure) at such a position that the upper surface thereof is coplanar with the upper surface of the base plate 19.

Thereafter, as is illustrated in FIG. 1B, bonding wires 13 are ball-bonded to the respective false electrodes 21 of the dummy chip 20 by using a bonding machine (not shown in the figure) in such a fashion that the bonded end is formed as an approximately semispherical terminal point 13A with the flat surface of the semisphere facing downwardly followed by second bonding of the other end of each of the bonding wires 13 to one of the electrode terminals 11 on the upper surface of the base plate 19 and trimming. This bonding work is completed for all of the false electrodes 21 on the dummy chip 20 and all of the electrode terminals 11 on the base plate 19.

After completion of the above described bonding work of the bonding wires 13, as is illustrated in FIG. 1C, a framework 29 to serve as a mold is mounted on the upper surface of the base plate 19 to surround the mounting opening or cavity 12 and the bonding wires 13. Thereafter, the framework 29 is filled with a flowable and thermally curable resin 14 such as a polyimide resin to fully embed the bonding wires 13. After curing of the resin, the framework 29 is removed to complete an encapsulating layer 14 of the resin which is adhesively bonded to the upper surface of the base plate 19 to cover the mounting opening 12 from above to ensure electrical insulation and mechanical protection of all of the bonding wires 13.

Finally, as is illustrated in FIG. 1D, the dummy chip 20 is removed by etching with an etching solution appropriately formulated depending on the material of the dummy chip 20. When the dummy chip 20 is made from copper, for example, the etching solution can be an aqueous solution of iron (III) chloride. In the thus completed wiring circuit board 10, as is illustrated in the figure, the approximately semispherical terminal points 13A of the bonding wires 13 are exposed to the mounting opening 12 sometimes as slightly protruded from the resinous encapsulating layer 14 due to the curing shrinkage of the thermocurable resin 14.

In mounting an actual IC die 30 on this wiring circuit board 10, the IC die 30 having bumped electrode terminals 31 is inserted into the mounting opening 12 of the wiring circuit board 10 from below, as is illustrated in FIG. 2, so as to bring the bumped electrode terminals 31 into contact with the respective terminal points 13A of the bonding wires 13 and secured in the position with elastic resilience by fastening a stopper member 38 onto the lower surface of the base plate 19 with intervention of a rubbery cushioning member 39 between the lower surface of the IC die 30 and the stopper member 38. It is of course that an IC die 30 once mounted on the wiring circuit board 10 in this manner can be easily demounted from the mounting opening 12 merely by removing the stopper member 38 and the cushioning member 39 so that any damaged or defective IC dies can be readily inspected as such by using a test circuit board or can be replaced with a normally working IC die without affecting the other parts of the circuit assembly.

Figure 4:
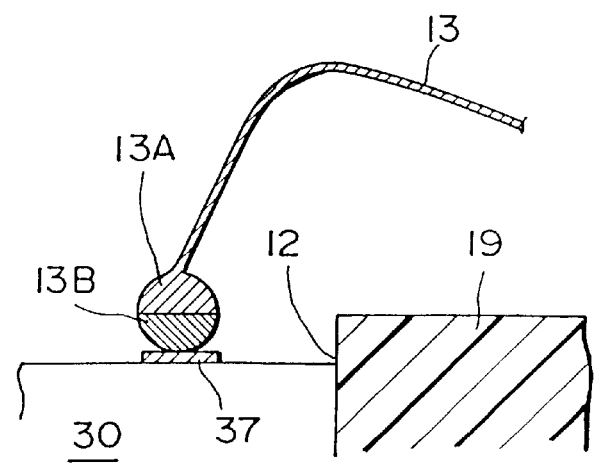
FIG. 4 is an enlarged partial schematic cross sectional view of the inventive wiring circuit board of a further different embodiment for mounting of a semiconductor chip device.

FIG. 4 illustrates an enlarged schematic partial cross sectional view of the inventive wiring circuit board 10 of a different embodiment, in which the terminal point of the bonding wire 13 is shaped in a spherical form by the addition of a complimentary semisphere 13B. The wiring circuit board 10 of this type is suitable for mounting an IC die 30 having electrode terminals 37 in the form of a land having a flat surface instead of a bumped electrode 31. The spherical terminal point 13B can be obtained by making a buildup of a solder alloy or a plating layer on the flat surface of the semispherical terminal point 13A after removal of the dummy chip 20 by etching as is illustrated in FIG. 1D followed by shaping into a spherical form. When the buildup is made from a solder alloy and the like having low corrosion resistance, it is preferable to provide the surface thereof with a plating layer of gold and the like having high corrosion resistance.

In the above, description is given that the semispherical or spherical terminal point 13A or 13B of the bonding wire 13 and the bumped electrode 31 or land electrode 37 of the IC die 30 are contacted with resilience by interposing a rubbery cushioning member 39 between the IC die 30 and the stopper member 39 as is illustrated in FIG. 2. It is also possible that the resilient contacting is ensured by means of one or more of coil or leaf springs provided on the inward surface of the stopper member 39 in place of the rubbery cushioning member 38 or, alternatively, by mounting the IC chip 30 with reflow soldering.

The principle of the present invention is applicable, besides the above described wiring circuit board 10, also to the structure of sockets, in which the base plate 19 in the wiring circuit board 10 is replaced with a frame member having a mounting space 12 and electrodes 11 and pins electrically connected to the electrode terminals are provided therein. The lower side of the mounting space 12 of the base plate is covered with a covering member and the like fastened with pins and the like and the bumped electrodes 31 of an IC die 30 are brought into resilient contact with the terminal points 13A of the bonding wires by means of a spring or rubbery cushioning member between the IC die 30 and the inward surface of the covering member.

What is claimed is:

1. A method for the preparation of a wiring circuit board for mounting of a semiconductor chip device which comprises the steps of:

(a) making a mounting opening, in which a semiconductor chip device is inserted, through a base plate provided with electrode terminals on one surface thereof;

(b) inserting, into the said mounting opening, a dummy chip having false electrodes on the upper surface at positions corresponding to the positions of electrode terminals of an actual semiconductor chip device, when inserted into the mounting opening, the upper surface of the dummy chip being substantially coplanar with the upper surface of the base plate having the electrode terminals;

(c) connecting each of the false electrodes of the dummy chip and corresponding electrode terminals on the base plate with at least one bonding wire;

(d) encapsulating the bonding wires with an encapsulating layer of a thermocurable resin; and (e) removing the dummy chip to expose one of the ends of each of the bonding wires appearing in the mounting opening.

2. The method for the preparation of a wiring circuit board for mounting of a semiconductor chip device as claimed in claim 1 in which the false electrodes on the dummy chip are formed by plating with a metal resistant against etching.

3. The method for the preparation of a wiring circuit board for mounting of a semiconductor chip device as claimed in claim 1 in which the dummy chip is made from a material susceptible to etching and removal of the dummy chip in step (e) is performed by etching.

4. The method for the preparation of a wiring circuit board for mounting of a semiconductor chip device as claimed in claim 1 in which the encapsulating resinous layer formed in step (d) is adhesively bonded to the surface of the base plate to cover the mounting opening.

* * * * *